(12) United States Patent
Ryoo

(10) Patent No.: US 6,767,808 B2
(45) Date of Patent: Jul. 27, 2004

(54) METHOD FOR FABRICATING SEMICONDUCTOR DEVICE

(75) Inventor: Chang-Woo Ryoo, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/331,579

(22) Filed: Dec. 31, 2002

(65) Prior Publication Data

US 2004/0053473 A1 Mar. 18, 2004

(30) Foreign Application Priority Data

Sep. 17, 2002 (KR) .................................. 10-2002-0056455

(51) Int. Cl.$^7$ ............................................... H01L 21/04
(52) U.S. Cl. ........................ 438/510; 438/289; 438/301
(58) Field of Search ............................ 438/510, 197, 438/289, 290, 291, 301, 770, 772, 914, 773

(56) References Cited

U.S. PATENT DOCUMENTS

| | | | |
|---|---|---|---|
| 5,955,754 A | * | 9/1999 | Azuma et al. ............... 257/295 |
| 6,066,547 A | * | 5/2000 | Maekawa ..................... 438/486 |
| 6,214,654 B1 | | 4/2001 | Yu |
| 6,225,197 B1 | * | 5/2001 | Maekawa ..................... 438/487 |
| 6,518,136 B2 | * | 2/2003 | Lee et al. ..................... 438/303 |

* cited by examiner

*Primary Examiner*—David Nhu
(74) *Attorney, Agent, or Firm*—Jacobson Holman PLLC

(57) ABSTRACT

A method for forming a p-channel metal-oxide semiconductor(PMOS) device is suitable for reducing the width of change of a threshold voltage by preventing a deterioration of a uniformity of dopants due to out diffusion and segregation of the dopants implanted into channel regions. The method includes the steps of: forming a channel region below a surface of a semiconductor substrate; activating dopants implanted into the channel region through a first annealing process performed twice by rising temperature velocities different to each other; forming a gate oxidation layer and a gate electrode on the semiconductor substrate subsequently; forming a source/drain regions at both sides of the gate electrode in the semiconductor substrate; and activating dopants implanted into the source/drain regions through a second annealing process performed at the same conditions of the first annealing process.

9 Claims, 4 Drawing Sheets

PRIOR ART

METHOD FOR FABRICATING SEMICONDUCTOR DEVICE

FIELD OF THE INVENTION

The present invention relates to a semiconductor memory device; and, more particularly, to a method for fabricating a semiconductor device having an improved channel characteristics.

DESCRIPTION OF RELATED ART

As the semiconductor device has been integrated, a channel length becomes to decrease. Although the size of the device becomes to reduce, concentrations of source and drain are still very high to improve a velocity thereof.

A short channel length allows a threshold voltage($V_T$) to fall rapidly as a distance between a source and a drain becomes short. The falling of the threshold voltage($V_T$) increases a leakage current at an atmosphere and generates a punch of the source and the drain to deteriorate the device characteristics. Specifically, in a p-channel metal-oxide semiconductor(PMOS) device major carriers are holes, a mobility of carriers of the PMOS is low 3 times in comparison with that of carrier, i.e., electrons, of an n-channel metal-oxide semiconductor(NMOS). Therefore, controls of concentration and positions of channel dopants and segregation from a field oxidation layer in the channel become very important.

FIG. 1A is a cross-sectional diagram showing a PMOS device in accordance with a conventional method.

Referring to FIG. 1A, an n-type well 13 is formed in a semiconductor substrate 11 formed therein a field oxidation layer 12 as a device isolation layer. A gate oxidation layer 14 and a gate electrode 15 are formed on a selected region on the semiconductor substrate 11. A p-type channel region 16 is formed below the gate oxidation layer 14 in the semiconductor substrate 11. And, p-type source/drain regions 17 are formed with adjoining to the p-type channel region 16 in aligning both edges of the gate electrode 15.

In the prior art shown in FIG. 1A, curing defects generated by an ion implantation or an activation of dopants is realized by annealing at a high temperature at one time during a well annealing without an annealing process for an additional electrical activation with respect to the channel regions or by a thermal oxidation process of a gate oxidation layer.

And, after the forming of the p-type source/drain regions 17, crystal defects necessarily generated during an ion implantation are removed and an annealing process is performed to activate the dopants. At this time, the annealing performed by raising a temperature at a low rising temperature velocity to a maximum process temperature at a time.

But, as shown in FIG. 1B, although the crystalline defects can be cured as the annealing process is proceeded at a high temperature during a long time, as a channel size of device becomes to decrease, dopants of the p-type channel regions 16 move into a bottom portion of the n-type well 13, inactivated dopants in the source/drain regions combine with vacancy to become an intrusion-type defect(x) and the intrusion-type defect(x) is diffused to an end portion of the bottom portion of the gate electrode 15 and the semiconductor substrate 11 in the form of bulk. Since borons as dopants of the p-type channel regions 16 are segregated to the intrusion-type defect(x) and a concentration nonuniformity of dopants is generated in the p-type channel regions 16, it is difficult to obtain a uniform distribution of dopants in a shallow channel region.

Also, as the device becomes smaller the threshold voltage becomes larger, in order to control this, although a doping concentration of the p-type channel region 16 becomes to increase, since a local annealing process for the p-type channel regions 16 does not implement in a conventional method, there is a problem that a local concentration gradient, i.e., a variation width of the threshold voltage in response to the nonuniformity of the dopants, becomes to increase.

Furthermore, after the formation of the p-type source/drain regions, conditions of annealing for the defect remove and an electrical activation of the impurities has a very high thermal budget in a high density integrated device with a shallow junction and a small size and a maintaining time is nearly ranged from 10 seconds to 20 seconds at a maximum process temperature. Such conditions cause the mobility to be reduced at a surface as diffusions are occurred in a longitudinal direction and a horizontal direction of junction, as a result, a drain saturation current is decreased and a dose of dopants implanted by a dopant diffusion is decreased to thereby reduce a contact resistance.

Therefore, the diffusion of dopants in the implanted channel regions is suppressed by lowering a thermal burden and the uniformity of dopants in the channel regions by preventing the segregation to the field oxidation layer, and also another thermal treatment process is required to recover the crystalline defect layer damaged during the ion implantation to form the source/drain regions and to electrically activate the dopants.

SUMMARY OF THE INVENTION

It is, therefore, an object of the present invention to provide solve the above-described problems of the conventional method and to provide a method for forming a p-channel metal-oxide semiconductor(PMOS) device suitable for reducing the width of change of a threshold voltage by preventing a deterioration of a uniformity of dopants due to out diffusion and segregation of the dopants implanted into channel regions.

It is another object of the present invention to provide a method for forming a PMOS device having a shallow junction and a low contact resistance.

It is another object of the present invention to provide a method for forming a PMOS device suitable for minimizing diffusions of channel and source/drain regions and for suppressing a movement of intruding type defects injected by an inactivation of dopants.

In accordance with one aspect of the present invention, there is provided a method for forming a p-channel metal-oxide semiconductor(PMOS) device, the method includes the steps of: forming a channel region below a surface of a semiconductor substrate; activating dopants implanted into the channel region through a first annealing process performed twice by rising temperature velocities different to each other; forming a gate oxidation layer and a gate electrode on the semiconductor substrate subsequently; forming a source/drain regions at both sides of the gate electrode in the semiconductor substrate; and activating dopants implanted into the source/drain regions through a second annealing process performed at the same conditions of the first annealing process.

In accordance with another aspect of the present invention, there is provided a method for forming a PMOS device, wherein each of the first annealing and the second annealing processes are includes a first step for first annealing by a velocity of a first rising temperature to a first process temperature at which a solid phase polycrystalline growth is occurred and a second step for annealing by a velocity of a second rising temperature from the first process temperature to a second process temperature of a maximum process temperature, respectively, wherein the velocity of the second rising temperature is relatively larger than that of the first rising temperature.

In accordance with another aspect of the present invention, there is provided a method for forming a PMOS device, wherein the first process temperature is ranged from 500° C. to 650° C. during the first annealing process and the velocity of the first rising temperature is ranged from 20° C./sec to 50° C./sec.

In accordance with another aspect of the present invention, there is provided a method for forming a PMOS device, wherein during the second annealing the second process temperature is ranged from 650° C. to 900° C.–1050° C. and the velocity of the second rising temperature is ranged from 100° C./sec to 200° C./sec

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a preferred embodiment of the present invention will be described in detail referring to the accompanying drawings.

In the following preferred embodiments, methods for improving short channel characteristics are proposed by preventing borons from segregating to a semiconductor substrate as channel and bulk regions and by realizing a uniformity of dopants in channel regions. This is achieved by suppressing a component such as an intrusion defect into the semiconductor substrate as the channel and bulk regions by reducing inactivated amount with increasing an electrical activation of borons which are employed as dopant of source/drain regions in a device having a short channel size, particularly in a p-channel metal-oxide semiconductor (PMOS) device.

Figure 1A:
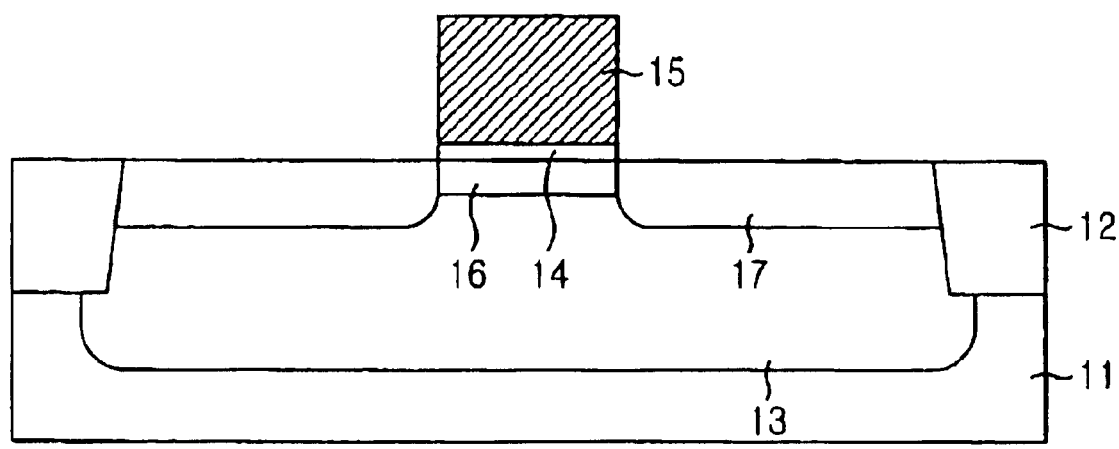
FIG. 1A is a cross-sectional diagram showing a p-channel metal-oxide semiconductor(PMOS) device in accordance with a conventional method.
Figure 1B:
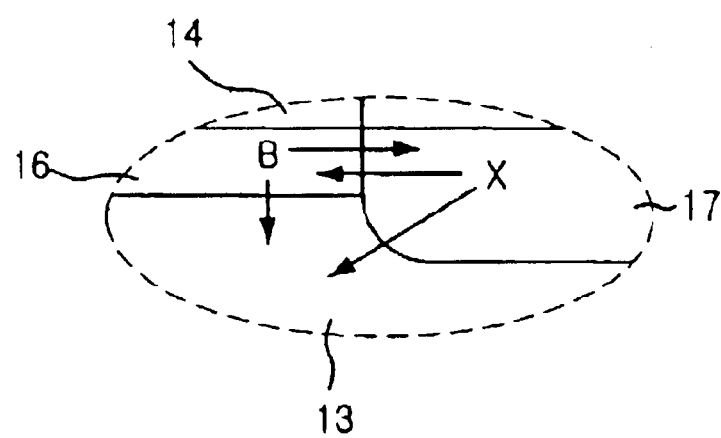
FIG. 1B shows a diagram representing a diffusion and segregation of boron in accordance with a conventional method.
Figure 2:
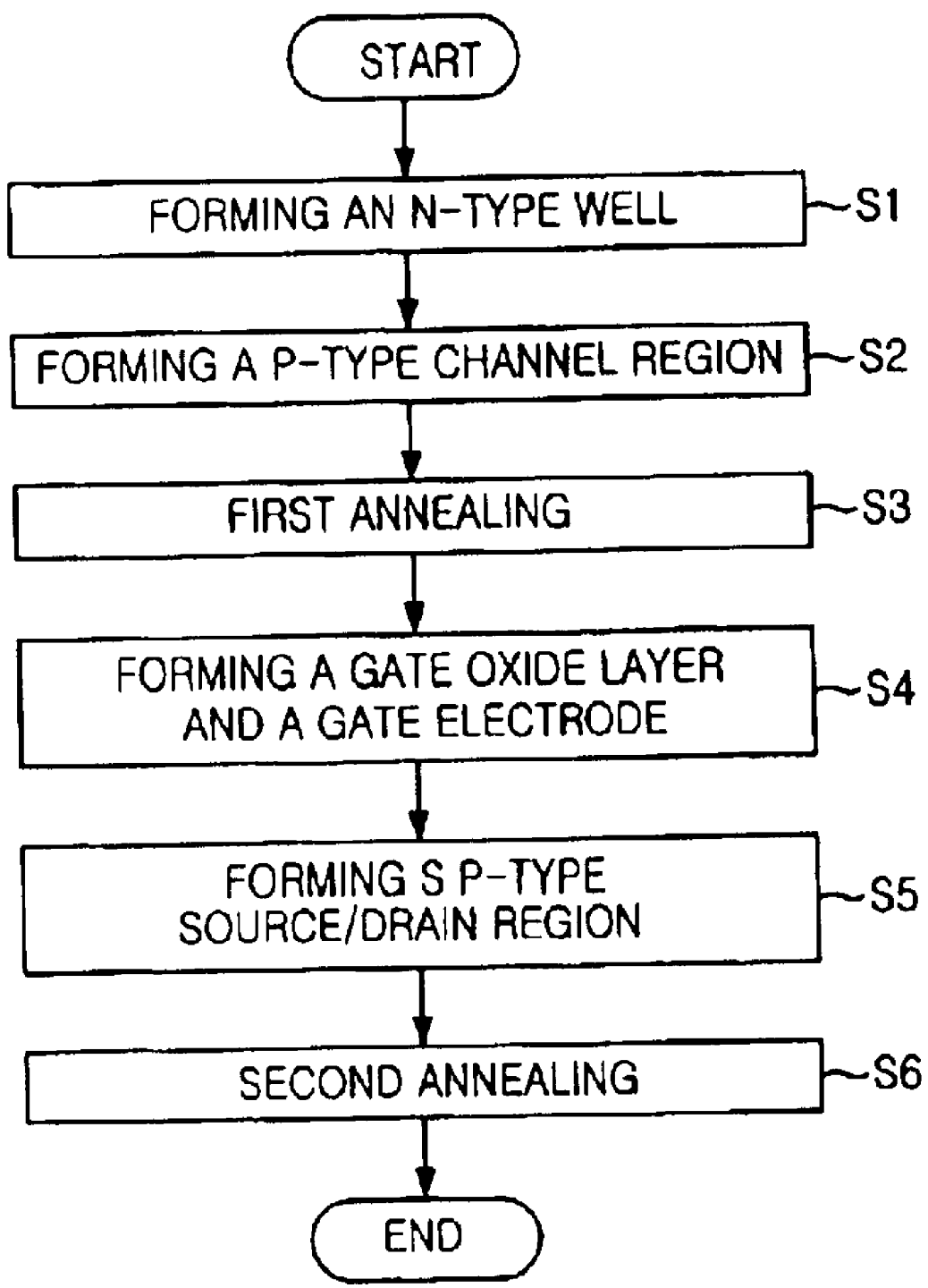
FIG. 2 illustrates a flow chart of PMOS device in accordance with a preferred embodiment of the present invention.

FIG. 2 illustrates a flow chart of PMOS device in accordance with a preferred embodiment of the present invention.

As shown in FIG. 2, a method for manufacturing a PMOS device includes a process(S1) for forming an n-type well, a process(S2) for forming a p-type channel region, a process (S3) of first annealing, a process(S4) for forming a gate oxidation layer and a gate electrode, a process(S5) for forming p-type source/drain regions and a process(S6) of second annealing.

Here, the first annealing process(S3) is performed to activate dopants implanted into channel regions, this process (S3) is performed before the formation of gate oxidation, and after a first annealing is performed at a temperature range from 500° C. to 650° C. by a low temperature rising speed of 20~50° C./sec, a second annealing is performed at a temperature range from 650° C. to 900~1050° C. by a high temperature rising speed of 100~200° C./sec. A temperature maintaining time is 0~1 second during the second annealing, the temperature rising speed is ranged from 100 to 200° C./sec, the first annealing is performed at a nitride atmosphere to prevent borons implanted into the p-type channel regions from slipping away from a surface and oxygen is supplied thereto with maintaining an oxygen rate with respect to the nitride below 10%.

And, the second annealing process(S6) is performed to activate dopants implanted into the source/drain regions, after the process(S6) is performed at a temperature range from 500° C. to 650° C. by a low temperature rising speed of 20~50° C./sec, a second annealing is performed at a temperature range from 650° C. to 900~1050° C. by at a high temperature rising speed of 100~200° C./sec. At this time, the boron(B) implanted into the p-type source/drain regions is prevented from out diffusing to outside of a surface by supplying a small amount of oxygen during the first annealing.

As described above, by performing the annealing to activate the dopants implanted into the channel regions and the source/drain regions at a very high temperature rising speed, the diffusion of dopants is reduced. And, since an exposing time and a maintaining time is short and a thermal burden is very low, the dopants implanted therein keep their profiles, as a result, a concentration becomes low and a mobility of carrier becomes to increase, a punch voltage is increased by keeping a high density of concentration by moving a small amount of dopants to the surface and the bulk in Rp and a concentration of a junction part in the bulk becomes low to reduce a parasitic capacitance.

FIGS. 3A to 3D are cross-sectional views showing a method for manufacturing the PMOS device shown in FIG. 2.

Figure 3A:
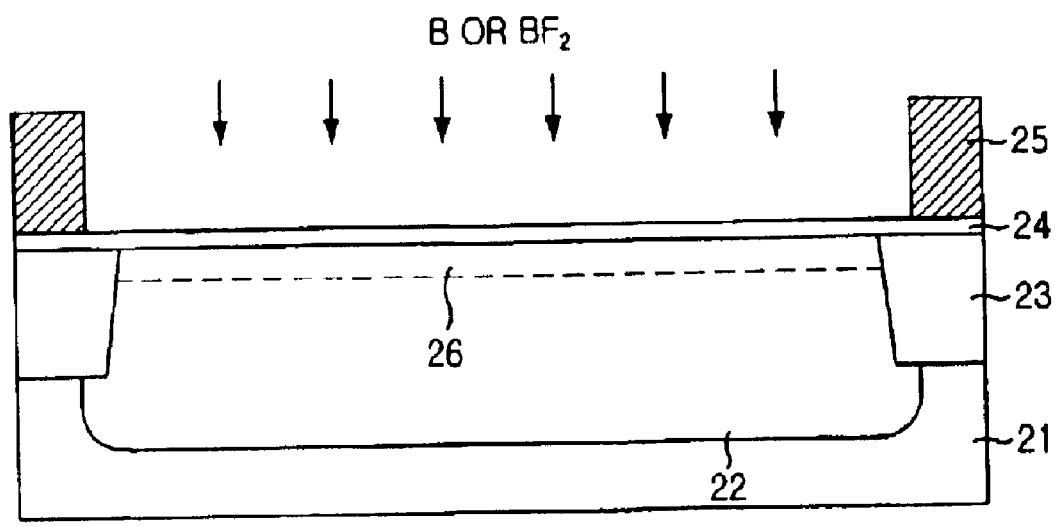
FIGS. 3A to 3D are cross-sectional views showing a method for manufacturing the PMOS device shown in FIG. 2.

As shown in FIG. 3A, after a field oxidation layer 22 as a device isolation layer is formed on a predetermined region of a semiconductor substrate 21 by a well known shallow trench isolation(STI) method or a local oxidation of silicon (LOCOS) method, a screen oxide layer 23 is formed on the semiconductor substrate 21. At this time, the screen oxide layer 23 is employed for preventing lattice damages from following ion implantation processes and it may be formed of a thermal oxide by thermal oxidizing the surface of the semiconductor substrate 21.

In an ensuing step, after a mask 24 to expose an active region on a top surface of the semiconductor substrate 21 is formed, an n-type well region 25 is formed by ion implanting an n-type dopant such as arsenic(As) into the active region of the semiconductor substrate 21 exposed by the mask 24.

In a following step, with remaining the mask 24, an ion such as a pure boron($_{11B}$) or a boron diflorin(BF$_2$) is implanted to form a boron implanted p-type channel region 26. At this time, if the pure boron($_{11B}$) is implanted, a dose of $1 \times 10^{12} \sim 1 \times 10^{13}$ ions/cm$^2$ is implanted at a range of 10 keV~40 keV and if the boron diflorin(BF$_2$) is implanted, a dose of $1 \times 10^{12} \sim 1 \times 10^{13}$ ions/cm$^2$ is implanted at a range of 25 keV~50 keV.

Figure 3B:
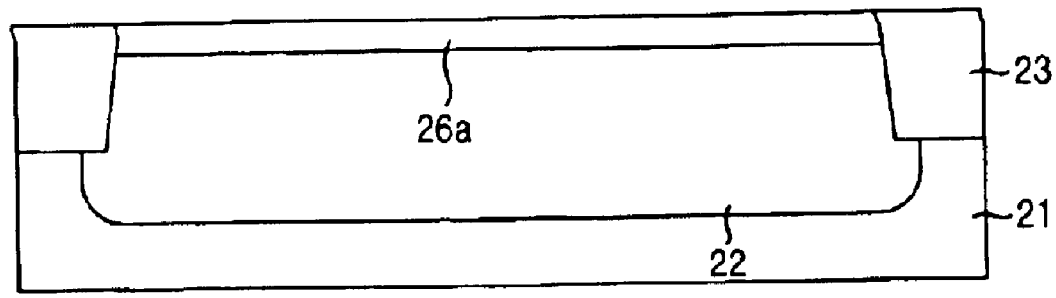

As shown in FIG. 3B, after the removal of the mask 24 and the screen oxide layer 23, after an ion implantation for forming the p-type channel region 26, the first annealing process having a small diffusion and a high electrical activation is performed in such a way that the p-type channel region 26 have a retrograde profile. Thus, after the first annealing the p-type channel region 26 becomes an electrically activated p-type channel region 26a.

For example, after the first annealing is performed at a temperature range from 500° C. to 650° C. by a low temperature rising speed of 20~50° C./sec, a second annealing is performed at a temperature range from 650° C. to 900~1050° C. by at a high temperature rising speed of 100~200° C./sec.

First, considering the first annealing, during the first annealing it is performed at a temperature range from 500° C. to 650° C. by a low temperature rising speed of 20~50° C./sec to generate a solid phase polycrystal growth at a temperature range from 500° C. to 650° C. thereby crystallizing an amorphous layer generated by the ion implantation toward the surface gradually.

And, to prevent the boron implanted into the electrically activated p-type channel region 26a during the first annealing from slip away to the outside of the surface it is performed at a nitride atmosphere, and oxygen is supplied with maintaining an oxygen rate with respect to the nitride below 10% so as to reduce the out diffusion of borons(B) toward outside of the surface. That is, by supplying oxygen, a narrow oxide layer(not shown) is formed on the surface of the semiconductor substrate 21, thereby increasing an amount of remaining borons(B) by preventing the borons(B) implanted into the electrically activated p-type channel region 26a during the first annealing from slipping away toward the outside of the surface.

In a next step, considering the second annealing, it is performed at a temperature range from 650° C. to 900~1050° C. by at a high temperature rising speed of 100~200° C./sec, wherein a temperature maintaining time is ranged from 0 to 1 second.

Thereafter, during the first annealing and the second annealing, to obtain a uniform distribution over an entire surface of a wafer, the wafer is rotated with inserting a nitrogen gas.

Such a rapid temperature rising speed allows a diffusion of borons(B), especially a diffusion to a side direction, as well as increases an electrical activation of the p-type channel region 26 by remaining borons(B) above the solid solubility as the same time. In other word, the solubility of dopants can be represented by a function of temperature, although the second annealing is performed at a high temperature, a high solubility can be maintained due to a short exposure time and a short maintaining time.

Similar to the second annealing, if the temperature rapidly rising to a maximum process temperature, the mobility of borons(B) is suppressed in the p-type channel region 26a as well as the degree of inactivation is reduced by increasing the electrical activation of the borons(B).

Since the first annealing as described above is a high temperature rising annealing, the first annealing has a sufficient low thermal burden, as a result diffusions especially to the side direction and the field oxidation layer 22 are reduced and a profile of super steep retrograde(SSR) channel is realized to thereby improve a short channel effect, wherein the profile represents that the SSR channel becomes a low concentration around the surface thereof, becomes a maximum concentration at a projection of range(Rp) and becomes a low concentration at the bulk.

Figure 3C:
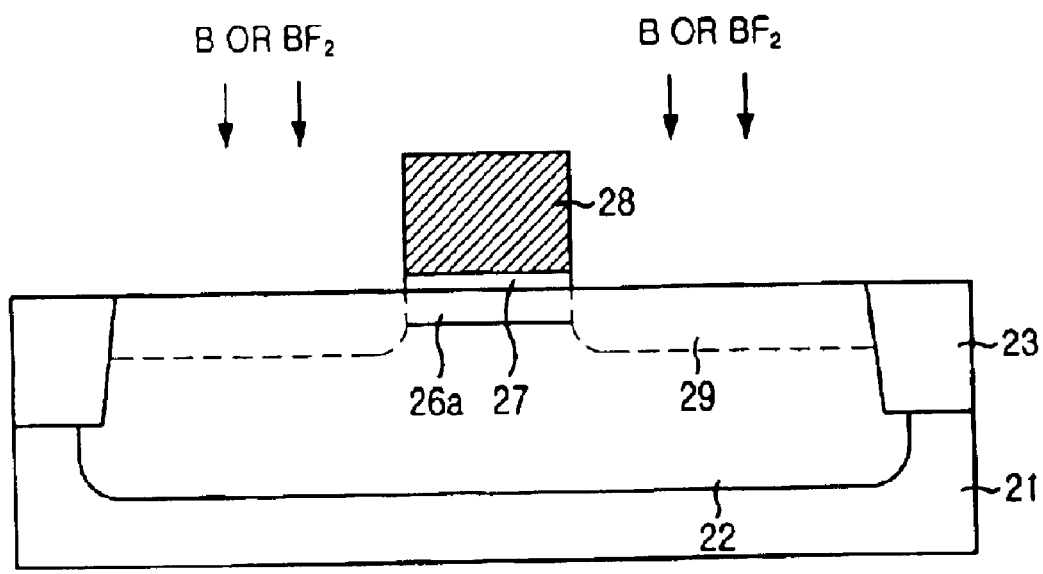

As shown in FIG. 3C, after a gate oxide layer 27, a gate electrode 28 are subsequently formed on a semiconductor substrate 21 formed thereon the p-type channel region 26a, p-type source/drain regions 29 is formed by ion implanting an ion such as a pure boron($_{11B}$) or a boron diflorin(BF$_2$) by utilizing the gate electrode 28 as a mask. At this time, conventionally an ion implantation to form the p-type source/drain regions 29 is performed by using a pure boron ($_{11B}$) or a boron diflorin(BF$_2$). If the pure boron($_{11B}$) is employed, a dose of $1 \times 10^{15} \sim 4 \times 10^{15}$ ions/cm$^2$ is implanted at a range of 10 keV~20 keV and if the boron diflorin(BF$_2$) is utilized, a dose of $1 \times 10^{15} \sim 4 \times 10^{15}$ ions/cm$^2$ is implanted at a range of 200 eV~5 keV.

Figure 3D:
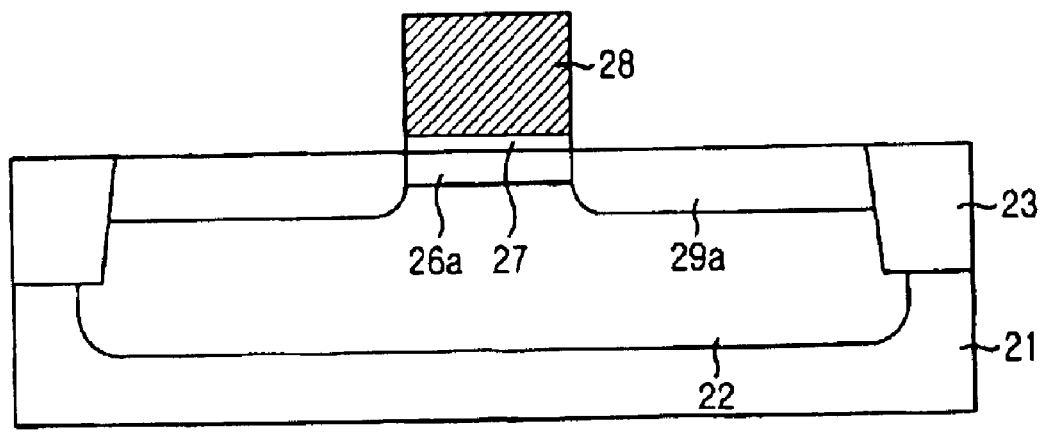

As shown in FIG. 3D, after the p-type source/drain regions 29 is formed, in order to recover an electrical activation and the damaged silicon lattice defects of the borons, the second annealing is performed. At this time, the second annealing is different from the conventional method, which raises the temperature to a maximum process temperature by a low temperature rising speed, in that raises the process temperature by twice, therefore, after the second annealing, the p-type source/drain regions 29 becomes an electrically activated p-type source/drain regions 29a.

Here, after the second annealing is performed at a temperature range from 500° C. to 650° C. by at a low temperature rising speed of 20~50° C./sec, it is performed at a temperature range from 650° C. to 900~1050° C. by at a high temperature rising speed of 100~200° C./sec.

First, considering the first annealing, during the first annealing it is performed at a temperature range from 500° C. to 650° C. by a low temperature rising speed of 20~50° C./sec to generate a solid phase polycrystal growth at a temperature range from 500° C. to 650° C., thereby crystallizing an amorphous layer generated by the ion implantation toward the surface gradually.

And, to prevent the boron implanted into the electrically activated p-type source/drain regions 29a during the first annealing from slip away to the outside of the surface it is performed at a nitride atmosphere, and oxygen is supplied with maintaining an oxygen rate with respect to the nitride below 10% so as to reduce the out diffusion of borons(B) toward outside of the surface. That is, by supplying oxygen, a narrow oxide layer(not shown) is formed on the surface of the semiconductor substrate 21, thereby increasing an amount of remaining borons(B) by preventing the borons(B) implanted into the electrically activated p-type source/drain regions 29a during the first annealing from slipping away toward the outside of the surface.

In a next step, considering the second annealing, it is performed at a temperature range from 650° C. to 900~1050° C. by at a high temperature rising speed of 100~200° C./sec, wherein a temperature maintaining time is ranged from 0 to 1 second.

Such a rapid temperature rising speed allows a diffusion of borons(B), especially a diffusion to a side direction, as well as increases an electrical activation of the p-type source/drain regions 29a by remaining borons(B) above the solid solubility as the same time. In other word, the solubility of dopants can be represented by a function of temperature, although the second annealing is performed at a high temperature, a high solubility can be maintained due to a short exposure time and a short maintaining time.

Similar to the second annealing, if the temperature rapidly rising to a maximum process temperature, the mobility of borons(B) is suppressed in the p-type source/drain regions 29a as well as the degree of inactivation is reduced by increasing the electrical activation of the borons(B).

That is, by reducing the degree of inactivation of the borons (B), the degree of combination between the borons and vacancy is reduced, and the segregation of borons(B) in the p-type channel region by decreasing an amount of intrusion-type defects in the source/drain regions 29a implanted into a direction of a bottom portion of the gate electrode 28 of the p-type channel region 26a.

Therefore, the uniformity of borons(B) in the p-type channel region 26a is improved by the second annealing, thereby improving a short channel characteristics, i.e., a threshold voltage difference and a drop in accordance/with a channel position, a leakage current at an atmosphere and a drop of punch voltage between the source region and the drain region.

On the other hand, borons may be slipped away toward outside of the surface during the second annealing, but since a shallow oxide layer(not shown) is formed on a top surface of the semiconductor substrate 21 by supplying oxygen during the first annealing, the borons are prevented from slipping away.

And, during the first annealing and the second annealing, to obtain a uniform distribution over an entire surface of a wafer, the wafer is rotated with inserting a nitrogen gas.

The present invention described above can be applicable to a memory device and an application specific integrated circuit(ASIC) device and it can propose an annealing technique for providing an application technology suitable for a high density integration circuit with decreasing its channel and junction in size.

And also, the present invention described above can keep a profile of a shallow channel in a channel region and can reduce a variation width of a threshold voltage by controlling a nonuniformity of local dopants by suppressing a segregation of dopants toward a side direction and a field oxidation layer.

In addition, the present invention can form a junction required a shallow junction and a low resistance by suppressing diffusions of dopants implanted into source/drain regions by increasing a solubility of dopants through two times of annealing processes.

While the present invention has been described with respect to the particular embodiments, it will be apparent to those skilled in the art that various changes and modifications may be made without departing from the spirit and scope of the invention as defined in the following claims.

What is claimed is:

1. A method for forming a p-channel metal-oxide semiconductor(PMOS) device, the method comprises the steps of:

forming a channel region below a surface of a semiconductor substrate;

activating dopants implanted into the channel region through a first annealing process performed twice by rising temperature velocities different to each other;

forming a gate oxidation layer and a gate electrode on the semiconductor substrate subsequently;

forming a source/drain regions at both sides of the gate electrode in the semiconductor substrate; and activating dopants implanted into the source/drain regions through a second annealing process performed at the same conditions of the first annealing process, wherein each of the first annealing and the second annealing processes includes a first step for first annealing by a velocity of a first rising temperature to a first process temperature at which a solid phase polycrystalline growth is occurred and a second step for annealing by a velocity of a second rising temperature from the first process temperature to a second process temperature from the first process temperature, respectively, and wherein the velocity of the second rising temperature is relatively larger than that of the first annealing temperature.

2. The method of claim 1, wherein the first process temperature is ranged from 500° C. to 650° C. during the first annealing process and the velocity of the first rising temperature is ranged from 20° C./sec to 50° C./sec.

3. The method of claim 1, wherein during the second annealing the second process temperature is ranged from 650° C. to 900° C.–1050° C. and the velocity of the second rising temperature is ranged from 100° C./sec to 200° C./sec.

4. The method of claim 1, wherein the first annealing process is performed at a nitride atmosphere and oxygen is supplied with maintaining an oxygen rate with respect to the nitride below 10%.

5. The method of claim 1, wherein a temperature maintaining time is ranged from 0 second to 1 second during the second annealing process.

6. The method of claim 1, wherein the first annealing process and the second annealing process are performed by rotating a wafer, respectively.

7. The method of claim 1, wherein the first annealing process and the second annealing process are performed by rotating a wafer, respectively.

8. The method of claim 1, wherein the step of forming the channel region implants pure boron in dose of $1\times10^{12}$~$1\times10^{13}$ ions/cm$^2$ in an energy of 10 keV~40 keV or implants boron diflorin in dose of $1\times10^{12}$~$1\times10^{13}$ ions/cm$^2$ in an energy of 25 keV~50 keV.

9. The method of claim 1, wherein the step of forming the source/drain regions implants pure boron or boron diflorin in dose of $1\times10^{15}$~$4\times10^{15}$ ions/cm$^2$, the pure boron is implanted in an energy of 10 keV~20 keV and the boron di diflorin is implanted in an energy of 200 eV~5 keV.

* * * * *